(12) United States Patent
Hu et al.

(10) Patent No.: US 10,930,474 B2
(45) Date of Patent: Feb. 23, 2021

(54) TOROIDAL PLASMA CHANNEL WITH VARYING CROSS-SECTION AREAS ALONG THE CHANNEL

(71) Applicant: MKS Instruments, Inc., Andover, MA (US)

(72) Inventors: Chaolin Hu, North Billerica, MA (US); Xing Chen, Lexington, MA (US)

(73) Assignee: MKS Instruments, Inc., Andover, MA (US)

( * ) Notice: Subject to any disclaimer, the term of this patent is extended or adjusted under 35 U.S.C. 154(b) by 294 days.

(21) Appl. No.: 15/646,017

(22) Filed: Jul. 10, 2017

(65) Prior Publication Data

US 2017/0309456 A1 Oct. 26, 2017

Related U.S. Application Data (62) Division of application No. 14/742,402, filed on Jun. 17, 2015, now abandoned, which is a division of
(Continued)

(51) Int. Cl.
*H01J 37/32* (2006.01)
*C23C 16/455* (2006.01)
(Continued)

(52) U.S. Cl.
CPC .. *H01J 37/32449* (2013.01); *C23C 16/45587* (2013.01); *C23C 16/45591* (2013.01);
(Continued)

(58) Field of Classification Search
CPC ........ C23C 16/45587; C23C 16/45591; C23C 16/50; F17D 1/04; G21B 1/17;
(Continued)

(56) References Cited

U.S. PATENT DOCUMENTS

| 5,834,905 A | 11/1998 | Godyak et al. |
| 6,432,260 B1 | 8/2002 | Leonard et al. |

(Continued)

FOREIGN PATENT DOCUMENTS

| DE | 276581 A1 | 11/2013 |
| JP | 59108295 | 7/1984 |

(Continued)

OTHER PUBLICATIONS

Bickerton et al,, The Positive Column in a Longitudinal Magnetic Field, 1956, Proc of the Physical Soc., Sec. B, vol. 69, No. 4, pp. 468-481. (Year: 1956).*

(Continued)

*Primary Examiner* — Benjamin Kendall
(74) *Attorney, Agent, or Firm* — Proskauer Rose LLP (57) ABSTRACT

An assembly for adjusting gas flow patterns and gas-plasma interactions including a toroidal plasma chamber. The toroidal plasma chamber has an injection member, an output member, a first side member and a second side member that are all connected. The first side member has a first inner cross-sectional area in at least a portion of the first side member and a second inner cross-sectional area in at least another portion of the first side member, where the first inner cross-sectional area and the second inner-cross-sectional area being different. The second side member has a third inner cross-sectional area in at least a portion of the second side member and a fourth inner cross-sectional area in at least another portion of the second side member, where the third inner cross-sectional area and the fourth inner-cross-sectional area being different.

20 Claims, 5 Drawing Sheets

Related U.S. Application Data application No. 13/672,156, filed on Nov. 8, 2012, now abandoned.

(60) Provisional application No. 61/560,058, filed on Nov. 15, 2011.

(51) Int. Cl.
| | | |
|---|---|---|
| *G21B 1/17* | (2006.01) | |
| *H05H 1/12* | (2006.01) | |
| *C23C 16/50* | (2006.01) | |
| *F17D 1/04* | (2006.01) | |

(52) U.S. Cl.
CPC ............ *C23C 16/50* (2013.01); *F17D 1/04* (2013.01); *G21B 1/17* (2013.01); *H01J 37/321* (2013.01); *H01J 37/32009* (2013.01); *H01J 37/32357* (2013.01); *H01J 37/32513* (2013.01); *H01J 37/32807* (2013.01); *H05H 1/12* (2013.01); *H01J 2237/006* (2013.01); *Y02E 30/10* (2013.01); *Y10T 137/0318* (2015.04); *Y10T 137/8376* (2015.04)

(58) Field of Classification Search
CPC ........ H01J 37/32009; H01J 37/321–37/32119; H01J 37/32357; H01J 37/32449; H01J 37/32513; H01J 37/32807; H01J 2237/006; H05H 1/12; H05H 1/46; Y02E 30/122; Y02E 30/126; Y10T 137/0318; Y10T 137/8376
See application file for complete search history.

(56) References Cited

U.S. PATENT DOCUMENTS

| | | | |
|---|---|---|---|
| 7,569,790 B2 | 8/2009 | Holber et al. | |
| 7,737,613 B2 | 6/2010 | Ham | |
| 2004/0206730 A1 | 10/2004 | Holber et al. | |
| 2005/0000655 A1 | 1/2005 | Wi | |
| 2006/0118240 A1 | 6/2006 | Holber et al. | |
| 2007/0079935 A1 | 4/2007 | Schuss et al. | |
| 2007/0245962 A1 | 10/2007 | Choi | |
| 2008/0236491 A1* | 10/2008 | Brcka ............ | H01J 37/321 118/723 I |
| 2009/0291027 A1* | 11/2009 | Choi ............ | H05H 1/46 422/105 |
| 2010/0206847 A1* | 8/2010 | Chen ............ | H01J 37/32357 216/67 |
| 2012/0212136 A1* | 8/2012 | Einav ............ | H01J 37/321 315/111.41 |

FOREIGN PATENT DOCUMENTS

| | | |
|---|---|---|
| JP | 2004311582 A | 11/2004 |
| JP | 2009266439 A | 11/2009 |
| KR | 100970139 B1 | 7/2010 |
| WO | 2005059986 A1 | 6/2005 |

OTHER PUBLICATIONS

Hoh et al., Diffusion Process in a Plasma Column in a Longitudinal Magnetic Field, 1960, Physics of Fluids, vol. 3, No. 4, pp. 600-607. (Year: 1960).*

Remy, Jerome; The International Search Report for PCT Application No. PCT/US2012/064970; dated Mar. 7, 2013; 4 pages.

\* cited by examiner

TOROIDAL PLASMA CHANNEL WITH VARYING CROSS-SECTION AREAS ALONG THE CHANNEL

CROSS REFERENCE TO RELATED APPLICATION

This application is a divisional of U.S. patent application Ser. No. 14/742,402 filed on Jun. 17, 2015, which is a divisional of U.S. patent application Ser. No. 13/672,156 filed on Nov. 8, 2012, now abandoned, and claims the benefit of and priority to U.S. Provisional Patent Application No. 61/560,058, filed Nov. 15, 2011, all of which are owned by the assignee of the instant application and the entire disclosures of which are incorporated herein by reference.

FIELD OF THE INVENTION

This invention relates generally to toroidal plasma devices and more particularly to toroidal plasma devices with channels that can have varying sizes to adjust to different plasma sizes.

BACKGROUND

Plasma discharges can be used to excite gases to produce activated gases containing ions, free radicals, atoms and molecules. Activated gases are used for numerous industrial and scientific applications including processing solid materials such as semiconductor wafers, powders, and other gases. The parameters of the plasma and the conditions of the exposure of the plasma to the material being processed vary widely depending on the application.

Plasmas can be generated in various ways including DC discharge, radio frequency (RF) discharge, and microwave discharge. DC discharges are achieved by applying a potential between two electrodes in a gas. RF discharges are achieved either by electrostatically or inductively coupling energy from a power supply into a plasma. Parallel plates are typically used for electrostatically coupling energy into a plasma. Induction coils are typically used for inducing current into the plasma. Microwave discharges are achieved by directly coupling microwave energy through a microwave-passing window into a discharge chamber containing a gas. Microwave discharges are advantageous because they can be used to support a wide range of discharge conditions, including highly ionized electron cyclotron resonant (ECR) plasmas. RF discharges and DC discharges inherently produce high energy ions and, therefore, are often used to generate plasma for applications where the material being processed is in direct contact with the plasma. Microwave discharges produce dense, low ion energy plasmas and, therefore, are often used to produce streams of activated gas for "downstream" processing. Microwave discharges are also useful for applications where it is desirable to generate ions at low energy and then accelerate the ions to the process surface with an applied potential.

A toroidal plasma device generates plasma in an inductive discharge in which the plasma current circulates in a toroidal plasma channel. By eliminating electrostatic coupling, the plasma current in a toroidal plasma device does not terminate at electrodes or chamber walls. This significantly reduces ion energies and surface erosion as compared to capacitively coupled discharges. In existing toroidal plasma devices, a toroidal plasma chamber typically has plasma channels with nearly-uniform cross-sectional areas. Gas injection can be a means for adjusting gas flow pattern and gas-plasma interactions within the plasma channels. However, performance of the plasma device remains limited by the chamber's design.

In a toroidal plasma channel, the gas temperature, composition, ionization rate and plasma impedance are not constant along the dimensions of the channel. As gases flow along the plasma-filled channel, they are heated and dissociated by the plasma. In existing toroidal plasma channel designs with a nearly uniform cross-section area, these changes in gas or plasma conditions create undesirable or uncontrolled gas flow patterns and plasma profiles. The control of gas flow pattern by swirling injector, while effective near the inlet where the injector is located, weakens as gases flow further down along a plasma channel. As a result, the plasma device is not optimized in the entire plasma channel. More power is used to achieve required gas dissociation because of insufficient gas-plasma interaction and excessive plasma-surface interaction. Erosion in a plasma channel is also high, especially in areas where plasma is pushed to chamber walls or near the exit where the temperature and the density of dissociated atomic species are high. The erosion location in the plasma channel is also difficult to predict as it depends on the power, flow, pressure and species. As a result, toroidal plasma devices have a limited lifetime.

SUMMARY OF THE INVENTION

In one aspect, the invention features a toroidal plasma channel with varying cross-section areas along the channel to optimize gas flow and gas-plasma interactions. The plasma channel can also eliminate a sharp drop in dissociation rate at some particular flow rates, which occurred in previous toroidal plasma channel designs. In addition, plasma flow and gas-plasma interactions can be optimized by utilizing channel designs that are customized for a particular application or use. Further, this plasma channel design can reduce surface erosions by centering the plasma in the channel and controlling its profile, thereby extending the useful lifetime of the plasma chamber.

In one aspect, there is an assembly for adjusting gas flow patterns and gas-plasma interactions that includes a toroidal plasma chamber and a gas injector. The toroidal plasma chamber includes an injection member, an output member, a first side member and a second side member. The first and second side members are connected to the injection member and output member. The first side member has a first inner cross-sectional area in at least a portion of the first side member and a second inner cross-sectional area in at least another portion of the first side member, such that the first inner cross-sectional area and the second inner-cross-sectional area are different. The second side member has a third inner cross-sectional area in at least a portion of the second side member and a fourth inner cross-sectional area in at least another portion of the second side member, such that the third inner cross-sectional area and the fourth inner-cross-sectional area are different. The gas injector can inject gas into the toroidal plasma chamber and cause a flow of gas for the formation of plasma within the toroidal plasma chamber.

In another aspect, there is an assembly for adjusting gas flow patterns and gas-plasma interactions that includes a toroidal plasma chamber. The toroidal plasma chamber includes an injection member, an output member, a first side member and a second side member. The first and second side members connect the injection member and output member. The first side member has an inner cross-sectional area that is different from the inner cross-sectional area of the second side member. A gas injector is used to inject gas into the toroidal plasma chamber, so that the injection of gas causes a flow of gas for the formation of plasma within the toroidal plasma chamber.

In yet another aspect, there is a kit for constructing a toroidal plasma chamber including an injection member capable of receiving and delivering a gas and an output member capable of allowing disassociated gas to flow out of the toroidal plasma chamber. A first side member and a second side member are capable of allowing gas and plasma to flow through a first inner cross-sectional area in at least a first portion and a second inner cross-sectional area in at least a second portion, respectively. The kit also includes a first inner cross-sectional area that is smaller than an inner cross-sectional area of a connecting portion of either the injection member or the output member, and a second inner cross-sectional area that is smaller than an inner cross-sectional area of a connecting portion of either the injection member or the output member. Water cooled connectors create a vacuum seal to prevent leakage of gas and plasma, and an electric break.

In yet another aspect, there is a method for adjusting gas flow patterns and gas-plasma interactions, including inserting a first side member into a toroidal plasma chamber that has a first inner cross-sectional area based on a first predetermined size of a plasma and inserting a second side member into a toroidal plasma chamber that has a second inner cross-sectional area based on a second predetermined size of a plasma. The method also includes injecting a gas into the toroidal plasma chamber, causing a flow of gas within the toroidal plasma chamber and generating plasma within the toroidal plasma chamber such that plasma flows through an opening of the first side member and through an opening of the second side member.

In yet another aspect, there is a method for replacing a side member of a toroidal plasma chamber, including removing a first connector connecting a first side member and an injection member, removing a second connector connecting the first side member and an output member, removing the first side member from the toroidal plasma chamber, and installing a second side member into the toroidal plasma chamber, the second side member being a replacement of the first side member. The method can also include installing the first connector to connect the second side member and the injection member and installing the second connector to connect the second side member and the output member.

Each aspect described above can include one or more of the following features. In embodiments, the first and second side members come in various shapes and configurations to enhance performance of the assembly, kits, or methods. For example, in an embodiment, the first inner cross-sectional area (e.g., a section of the first side member) and the third inner cross-sectional area (e.g., a section of the second side member) can be the same. In various embodiments, the first side member and the second side member have a complementary shape. In some embodiments, the first side member and the second side member can be parallel. In embodiments, an inner cross-sectional area along the first side member and an inner cross-sectional area along the second side member can be connected in a smooth contour for continuous fluid flow.

In some embodiments, the first and second side members have cross-sectional areas that can vary in size. The first inner cross-sectional area and the third inner cross-sectional area can be in the range of 2 to 50 $cm^2$. The second inner cross-sectional area and the fourth inner cross-sectional area can be in the range of 3 to 80 $cm^2$. The first inner cross-sectional area and the third inner cross-sectional area can be downstream of the second inner cross-sectional area and the fourth inner cross-sectional area, respectively, along the toroidal plasma chamber.

In various embodiments, the first and second side members are removable. Both the first side member and the second side member can be connected to the injection member and the output member with connectors that create a vacuum seal to prevent leakage of gas and plasma and an electric break. In some embodiments, the connectors can be fluid cooled. The first side member and the second side member can be removable. The size of the first and the second side members can substantially match the size of plasma that is flowing through the toroidal plasma chamber.

The above aspects of invention have numerous advantages over the conventional state. For example, the invention can control gas flow and plasma profile. The invention can also increase dissociation rate of reactive gases and reduce toroidal plasma channel erosion. This can possibly extend product life while increasing power efficiency and improving plasma stability. The invention can also lower manufacturing costs and improve serviceability.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

DETAILED DESCRIPTION

The present invention provides assemblies, kits, and methods for using toroidal plasma devices to adjust gas flow patterns and gas-plasma interactions. In general, toroidal plasma devices have a toroidal plasma chamber.

Figure 1:
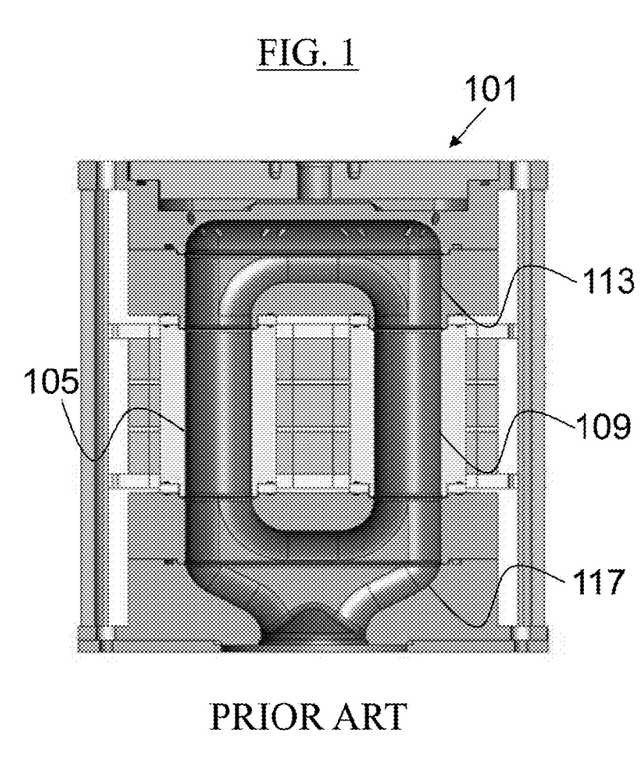
FIG. 1 is a prior art image of a toroidal plasma chamber.

FIG. 1 shows a prior art embodiment of a toroidal plasma chamber 101. The toroidal plasma chamber 101 has a first side member 105 and a second side member 109. The toroidal plasma chamber 101 also has an injection member 113 and an output member 117. The injection member 113 is a point of entry where gas is introduced into the toroidal plasma chamber 101. The output member 117 is a point of exit where gas is permitted to exit the toroidal plasma chamber 101. A flow of gas will pass through both the first side member 105 and the second side member 109, encircling a channel inside the toroidal plasma chamber 101.

In existing toroidal plasma devices, the plasma channels have nearly-uniform cross-section areas. The first side member 105 has a substantially uniform cross-sectional area along its entire length. The second side member 109 also has a substantially uniform cross-sectional area along its entire length. The first side member 105 and the second side member 109 can have substantially the same-sized uniform cross-sectional area. In some embodiments, the first side member 105 and the second side member 109 are identical. Additionally, a point of connection between the first side member 105 and the injection member 113 and a point of connection between the first side member 105 and the output member 117 can have the same cross-sectional area. A point of connection between the second side member 109 and the injection member 113 and a point of connection between the second side member 109 and the output member 117 can have the same cross-sectional area. Gas injection can be used for adjusting gas flow pattern and gas-plasma interactions; however, this method restricts performance of the plasma device.

Figure 2:
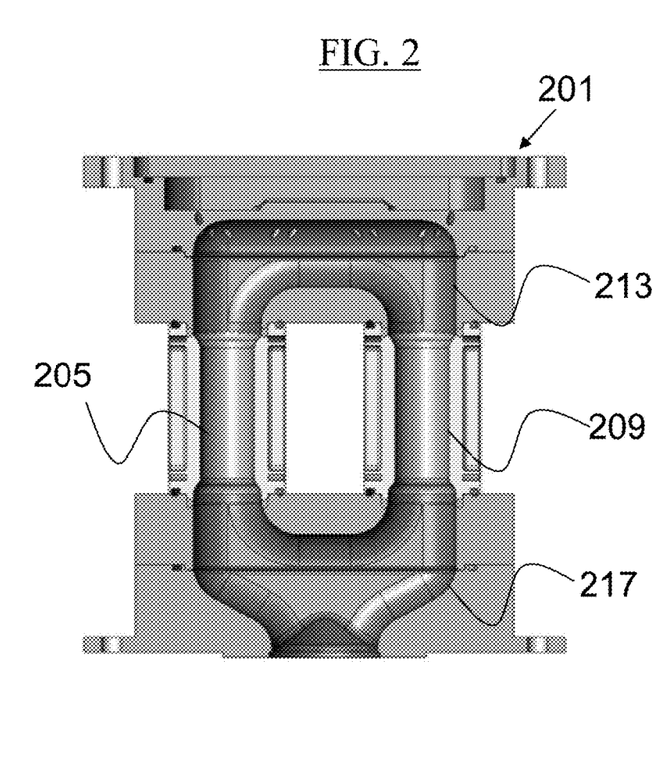
FIG. 2 is an image of a toroidal plasma chamber with side channels having smaller diameters, according to an illustrative embodiment of the invention.

FIG. 2 shows a toroidal plasma chamber with side channels having smaller diameters than the diameter of all other parts of the toroidal plasma chamber. The toroidal plasma chamber 201 has a first side member 205 and a second side member 209. A portion of the first side member 205 has a cross-sectional area that is smaller than another portion of the first side member 205 (e.g., the top and bottom portions of the first side member 205 have a larger diameter than the middle portion). A portion of the second side member 209 has a cross-sectional area that is smaller than another portion of the second side member 209 (e.g., the top and bottom portions of the second side member 209 have a larger diameter than the middle portion). The toroidal plasma chamber 201 also has an injection member 213 and an output member 217.

The plasma channel design can have non-uniform cross-sectional areas and/or shapes along a plasma channel to better accommodate changing gas flow and plasma conditions. For example, as shown in FIG. 2, the middle sections of segmented plasma channel (e.g., the first side member 205 or the second side member 209), where most gas-plasma interactions occur, can be made smaller than the inlet and exit sections. In some embodiments, the diameters of the middle plasma channel sections can be, for example, reduced from 1.25" to about 1", while the inlet and outlet sections can remain at 1.25". The inlet section (e.g., the injection member 213) can control the gas flow pattern while the exit section (e.g., the output member 217) can allow activated gases to flow out of the plasma channel smoothly. The inner contour of the reduced middle sections can be contoured to ensure smooth transition from a large diameter area to avoid erosion of the plasma channel surface. In some embodiments, a coating can be applied to the plasma channel to further avoid erosion.

As a result of customizing the internal areas of the plasma channel, improvements in gas dissociation can be made, even at low pressures where gas interactions are less frequent. That is, a smaller (or tailored) cross-sectional area in the middle sections can provide a higher probability for the gas to react with plasma. A coating on the plasma channels can be used in various embodiments, including, for example, embodiments in which the material forming portions of the toroidal plasma chamber is reactive with the plasma. The diameter of the plasma channel can take into account a thickness of the coating. That is, a dielectric or other material which does not interact with the plasma can be provided on the chamber wall. For example, in some embodiments, the plasma channel is made of metal such as aluminum, and the inner surface (e.g., area) is coated with a layer of aluminum oxide, silicon oxide, aluminum nitride, yttrium oxide, yttrium-aluminum oxide, or other dielectric materials. In other embodiments, the plasma channel can also be made of a dielectric such as quartz. The surface of the quartz toroidal plasma chamber can be bare or can include a coating material, such as aluminum oxide, aluminum nitride, yttrium oxide, or yttrium-aluminum oxide.

Optimization of the plasma channel can improve the toroidal plasma chamber's performance. By optimizing the plasma channel, the plasma profile can be controlled and plasma can be centered. Having a diameter (or cross-sectional dimension for a non-circular cross-section) of the toroidal plasma chamber being slightly larger than the diameter of the plasma can be optimal for the toroidal plasma chamber (e.g., minimize wear on the toroidal plasma chamber). Optimization can also potentially increase the lifetime of the parts of the toroidal plasma chamber. Additionally, certain parts can be designed to be sacrificial. The toroidal plasma chamber can be designed so that certain parts or areas will be more likely to be affected by erosion. Having sacrificial parts can reduce costs since only those parts have to be replaced (as opposed to the entire toroidal plasma chamber). In some embodiments, the side channels are designed to be sacrificial.

Figure 3A:
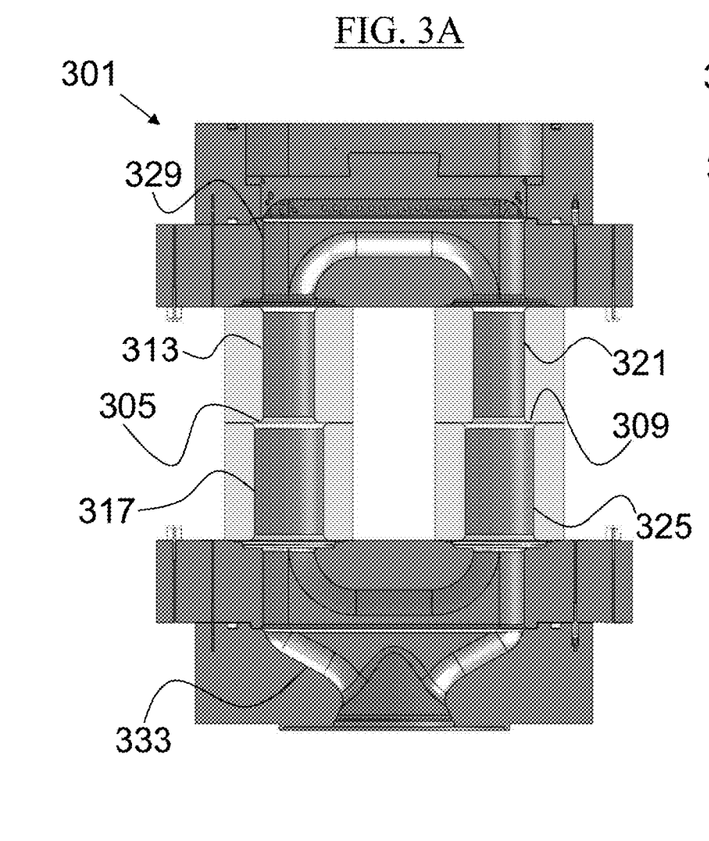
FIG. 3A is an image of a toroidal plasma chamber with side channels each having two cross-sectional diameters, according to an illustrative embodiment of the invention.

FIG. 3A shows a toroidal plasma chamber 301 with side channels each having different two cross-sectional diameters. The first side member 305 and the second side member 309 have two cross-sectional areas each. The first side member 305 has a first inner cross-sectional area 313 and a second inner cross-sectional area 317. The second side member 309 has a third inner cross-sectional area 321 and a fourth inner cross-sectional area 325. The toroidal plasma chamber 301 also has an injection member 329 and an output member 333.

In some embodiments, the first inner cross-sectional area 313 and the third inner cross-sectional area 321 can be in the range of 2 to 50 $cm^2$. The second inner cross-sectional area 317 and the fourth inner cross-sectional area 325 can be in the range of 3 to 80 $cm^2$. The inner cross-sectional areas can be connected in a smooth contour for continuous fluid flow.

A plasma channel with varying cross-section areas along the channel can be used to optimize gas flow and gas-plasma interactions. The gas dissociation rate can increase at some threshold power levels. When a higher power is used, a dissociation rate can be at or near saturation. In some embodiments, 2 to 30 kW of power is used with the toroidal plasma device. Higher power can also eliminate drops in dissociation rate at some particular flow rates. The toroidal plasma device can apply pressure of 0.1 to 50 torr at a flow rate of 1-100 liters per minute. The plasma channel designs in accordance with the present invention can, in some embodiments, force the flow of plasma to travel substantially down the center of the channel. Controlling the flow of plasma can prevent plasma from touching the sides of the channel, thereby reducing or eliminating serious erosions that can occur when plasma does come into contact with the sides of a channel. That is, in some embodiments the side members can be removed and replaced with side members having different cross-sectional dimensions in order to increase the lifetime of the plasma chamber and/or to accommodate a desired plasma flow pattern. In other embodiments, the side members can be removed and replaced as needed with identical side members.

Figure 3B:
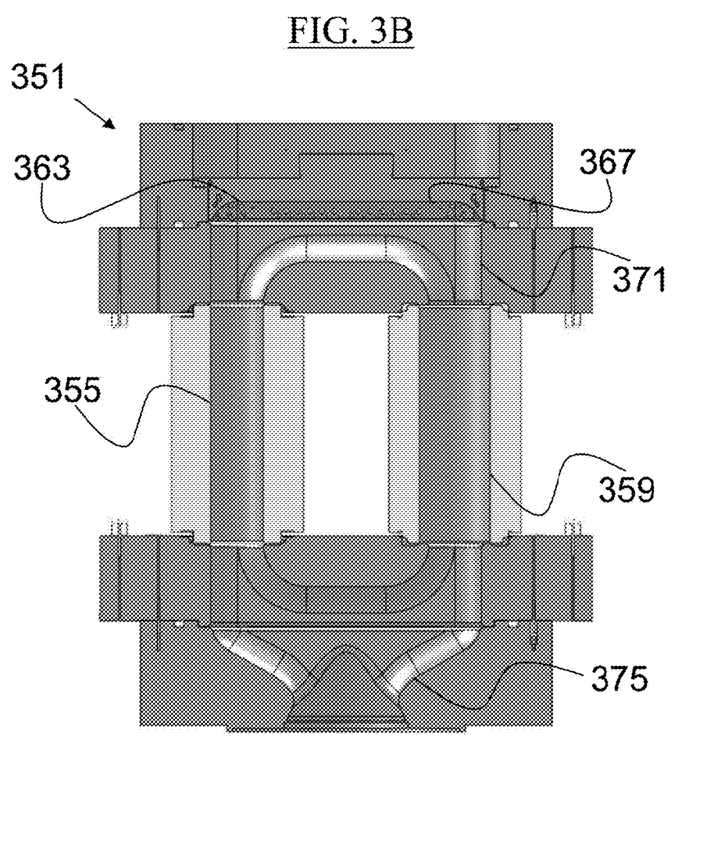
FIG. 3B is an image of a toroidal plasma chamber with side channels having different inner cross-sectional areas than each other, according to an illustrative embodiment of the invention.

FIG. 3B shows a toroidal plasma chamber 351 with a first side member 355 having a different inner cross-sectional area than that of a second side member 359. Two inlet gases or mixtures of gases are flowed into a plasma channel through gas inlets 363 and 367, which is part of an injection member 371, and are located adjacent to the first side member 355 and the second side member 359, respectively. After being excited in the first and second side members of the plasma channel, the gases mix in an output member 375 and subsequently flow out of the plasma chamber 351. The inner cross-sectional areas of the first and second side members 355 and 359 can be selected based on the properties of the gases (flow rate and chemical properties) and the plasmas (e.g. resistivity, electron life time, plasma diffusion length). This can allow optimization of energy efficiency and/or control of gas chemistries.

Figure 4A:
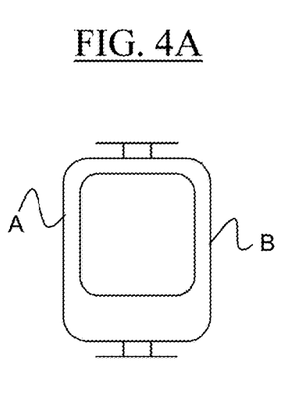
FIG. 4A is an image of a toroidal plasma chamber with an output member having a larger diameter than any other member's diameter, according to an illustrative embodiment of the invention.
Figure 4B:
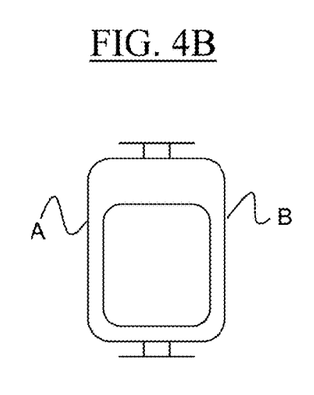
FIG. 4B is an image of a toroidal plasma chamber with an injection member having a larger diameter than any other member's diameter, according to an illustrative embodiment of the invention.
Figure 4C:
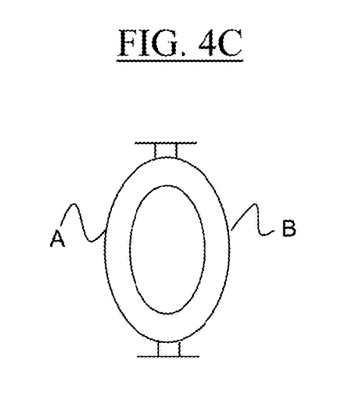
FIG. 4C is an image of an elliptical toroidal plasma chamber, according to an illustrative embodiment of the invention.
Figure 4D:
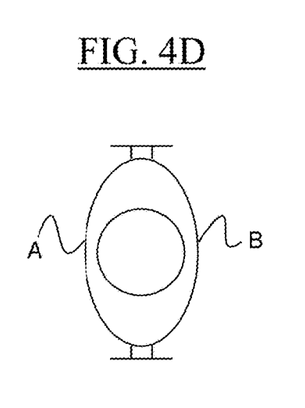
FIG. 4D is an image of an elliptical toroidal plasma chamber with output and injection members having a larger diameter than both of the side members, according to an illustrative embodiment of the invention.

The size of plasma can vary not only from configuration (e.g., flow rate, temperature, pressure, etc), but also from within the toroidal plasma device. To accommodate for various sizes of plasma, a toroidal plasma chamber can be configured in many shapes and sizes. FIG. 4. shows a number of various configurations for the toroidal plasma chamber. The various parts of a toroidal plasma chamber can come in any shape or size to accommodate a desired plasma flow pattern. The manner in which a toroidal plasma channel can be configured is not limited to the exemplary figures shown in FIG. 4. In some embodiments, the side members can have complimentary shapes (e.g., side members A and B as shown in FIGS. 4C and 4D). In other embodiments, the side members can be parallel (e.g., side members A and B as shown in FIGS. 4A, 4B, 4E, and 4F). In addition, parts of the toroidal plasma chamber can be replaceable and interchangeable. In embodiments, an injection member or an output member can be the parts of a toroidal plasma channel that varies in size and/or shape (e.g., as shown in FIGS. 4A and 4B). In other embodiments, an injection member or an output member may be part of the same member as a first side member or a second side member (e.g., as shown FIG. 4F). In various embodiments, a toroidal plasma chamber may have more than four parts or less than four parts (e.g., parts are not limited to just an injection member, an output member, a first side member, and a second side member). The shape of the chamber can be selected for use in a particular application to accommodate the plasma flow such that plasma chamber interactions are either minimized or located at chamber parts which can be easily replaced.

Figure 4E:
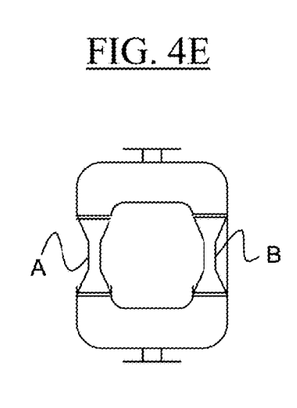
FIG. 4E is an image of a toroidal plasma chamber with bowtie-shaped side channels, according to an illustrative embodiment of the invention.
Figure 4F:
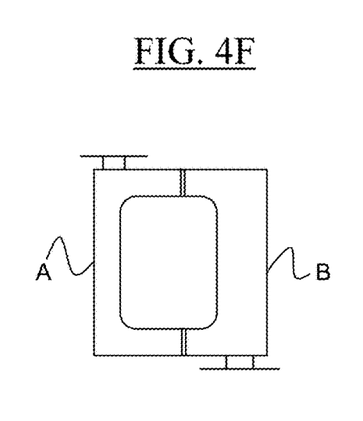
FIG. 4F is an image of a toroidal plasma chamber with side channels having different sized diameters, according to an illustrative embodiment of the invention.

FIG. 4A shows an exemplary toroidal plasma chamber with an output member having a larger diameter than any other member's diameter. FIG. 4B shows an exemplary toroidal plasma chamber with an injection member having a larger diameter than any other member's diameter. FIG. 4C shows an exemplary elliptical toroidal plasma chamber. FIG. 4D shows another exemplary elliptical toroidal plasma chamber with output and injection members having a larger diameter than both of the side members. FIG. 4E shows an exemplary toroidal plasma chamber with bowtie-shaped side channels. FIG. 4F shows an exemplary toroidal plasma chamber with side channels having different sized diameters. FIG. 4F also shows an exemplary toroidal plasma chamber with a first side member that includes an injection member and a second side member that includes an output member.

Figure 5:
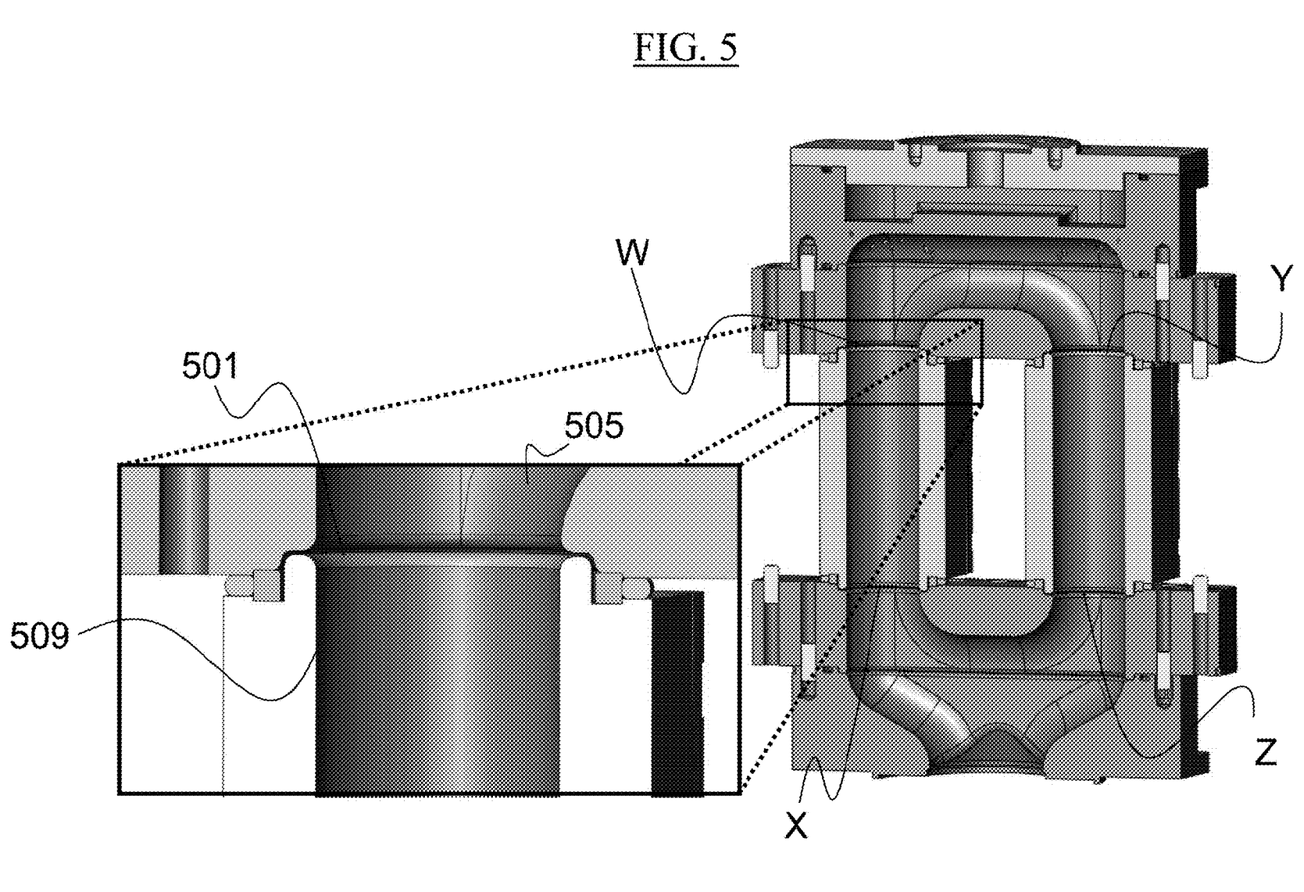
FIG. 5 is an image of toroidal plasma chamber with a detailed image of a connector, according to an illustrative embodiment of the invention.

FIG. 5 shows a toroidal plasma chamber with an expanded image of a connector 501. The connector 501 joins an injection member 505 and a first side member 509. In FIG. 5, there are four connectors (e.g., one located at each of W, X, Y, and Z).

In some embodiments, the connector 501 can create a vacuum seal to prevent leakage of gas and plasma. The connector 501 can also create a voltage or electric break for the toroidal plasma device. For example, in some embodiments, the connector 501 includes a dielectric spacer positioned therein to form an electric break. In the embodiment shown in FIG. 5, the electric break is a coating applied to inner, outer, and end surfaces of the connector 501. In some embodiments, the electric break is a coating applied to one or more of the inner, outer and end surfaces of the connector. Exemplary coating materials include, but are not limited to aluminum oxide, silicon oxide, aluminum nitride, yttrium oxide, and yttrium-aluminum oxide.

In embodiments in which the connector 501 includes a vacuum seal, the dielectric spacer can also provide mechanical support to an elasmer o-ring which forms the vacuum seal. In these embodiments, the electric break is an element or member that protects the o-ring from plasma and ultraviolet light radiated from the plasma. The connector 501 can also ensure a smooth connection between that various parts of the toroidal plasma chamber such that multiple parts of the toroidal plasma chamber can come together with little to no effect to the smoothness of the inner channel, allowing plasma flow through the toroidal plasma chamber without encountering substantial disruptions or discontinuities.

In some embodiments, plasma chamber members are removable from the chamber. For example, the first side member 509 can be removed from the toroidal plasma chamber by disconnecting at connector 501 without destroying the chamber. As a result, connector 501, injection member 505, and/or the first side member 509 can be removed and replaced to increase the lifetime of the plasma device. For example, if the first side member 509 becomes worn, the connector 501 can be freed and the first side member 509 can be disconnected from the injection member 505, so that the first side member 509 can be removed. A new side member can be interchanged with the worn one. Alternatively or in addition, if the connector 501 is worn, the connector can be interchanged with a new connector. The connector 501 can be reusable. The connector 501 can also be used with a number of different and interchangeable toroidal plasma chamber parts that can come in different shapes and sizes.

In some embodiments, the connector 501 is formed of a number of segments. The connector 501 can be made up of joints that can be made up of a number of segments (e.g., 2, 3, 4 and 5). In some embodiments, the connector 501 may be 4-8 segments. An advantage of a connector formed of a number of parts is the ability to distribute the electric potential along a toroidal plasma channel, and to replace/interchange just a portion (or a segment) of the connector. Another advantage is to form the segments out of different materials based upon their function. This advantage may result in cost savings as the inclusion of expensive materials may be limited to areas of need only.

In some embodiments, a coating may be applied to the entirety of the connector. A coating can be applied to the connector 501 to protect the connector as well as the parts of the toroidal plasma chamber that it is connecting. In certain embodiments, the coating is applied only to sacrificial parts. The coating can be made of materials such as aluminum oxide, silicon oxide, aluminum nitride, yttrium oxide, or yttrium-aluminum oxide, depending on applications.

Figure 6:
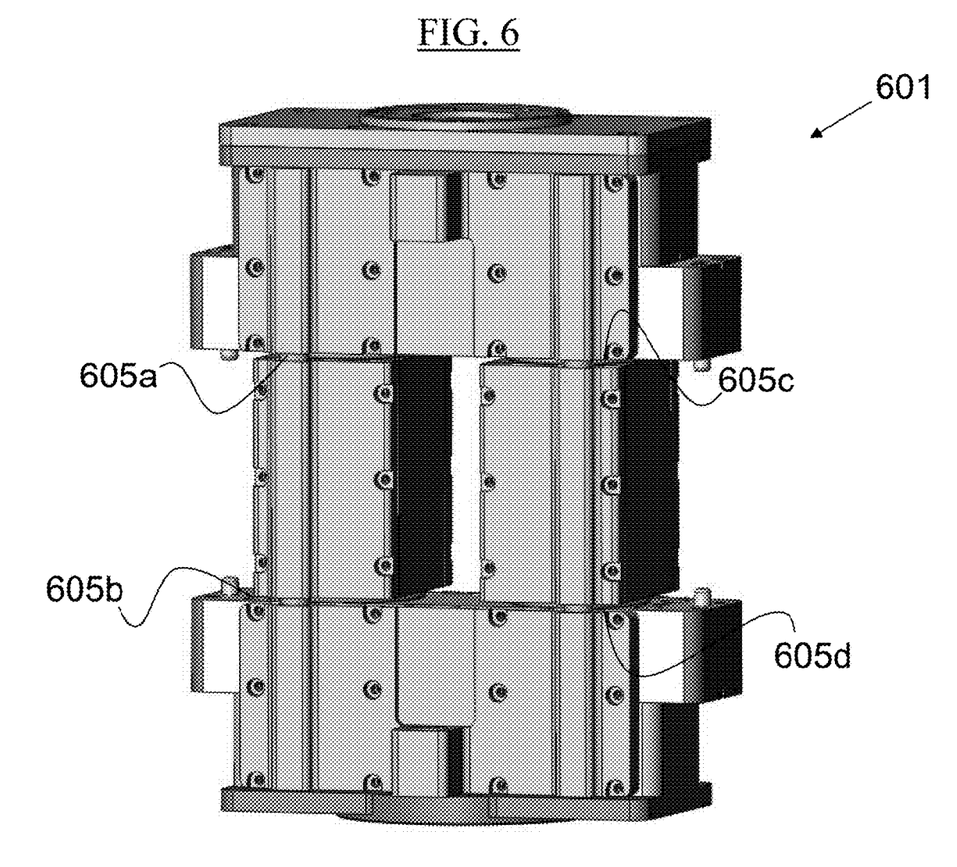
FIG. 6 is an image of the water-cooling apparatus for a toroidal plasma chamber, according to an illustrative embodiment of the invention.

In some embodiments, the connector 501 can also be water-cooled. FIG. 6 shows a water-cooling apparatus 601 for a toroidal plasma chamber. The water-cooling apparatus 601 has four connector cooling areas 605 for cooling the connectors W, X, Y, and Z of FIG. 5.

In some embodiments, the connector 501 can be any type of fitting, adapter, or coupling. In some embodiments, a connector 501 is not necessary and the first side member (e.g., first side member 305 as shown above in FIG. 3) or the second side member (e.g., second side member 309 as shown above in FIG. 3) can be attached to a toroidal plasma chamber without the need for a separate component. In some embodiments, a side member is threaded to allow the side member to be screwed to an injection member or an output member. A side member can also be crimped so that an injection member or an output member fits over the side member. Other forms of connection without the connector 501 known to those of ordinary skill in the art can also be used.

The water-cooling apparatus 601 can cool a toroidal plasma chamber through convectional cooling. Heat is generated within the toroidal plasma chamber as gas is dissociated. The water-cooling apparatus 601 can cool the toroidal plasma chamber by drawing away heat through water that flows through. The connectors of FIG. 5 can be fitted so that the water-cooling apparatus 601 has gaps that match the electric breaks in the connector. For example, in some embodiments, the connector cooling area 605*a* and 605*c* cools the connector from the side of the injection member while the connector cooling area 605*b* and 605*d* cools the connector from the side of one of the side members.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A method for adjusting gas flow patterns and gas-plasma interactions, the method comprising:

providing a toroidal plasma chamber comprising an injection member, an output member, a first side member and a second side member, the first side member connecting a first end of the injection member and the output member, and the second side member connecting a second end of the injection member and the output member, wherein the injection member, the output member, the first side member and the second side member form a toroidal plasma channel; and injecting, via a first gas injector, a first gas into the first side member of the toroidal plasma chamber through the first end of the injection member, wherein the first side member has an inner cross-sectional area selected to substantially match a size of a plasma formed using the first gas; and injecting, via a second gas injector, a second gas into the second side member of the toroidal plasma chamber through the second end of the injection member, wherein the second side member has an inner cross-sectional area selected to substantially match a size of a plasma formed using the second gas; and forming a plasma within the toroidal plasma chamber based on a flow of gas caused by the injection of the first and second gases, wherein a plasma current circulates continuously in the toroidal plasma channel, wherein the first gas and the second gas are different gases, and the inner cross-sectional area of the first side member is different from the inner cross-sectional area of the second side member.

2. The method of claim 1 wherein the first side member and the second side member have a complementary shape.

3. The method of claim 2 wherein the first side member and the second side member are parallel.

4. The method of claim 1 wherein both the first side member and the second side member are connected to the injection member and the output member with connectors that create a vacuum seal to prevent leakage of gas and plasma and an electric break.

5. The method of claim 4 further comprising fluid-cooling the connectors.

6. The method of claim 5 wherein the fluid is water.

7. The method of claim 1 wherein the first side member and the second side member are removable.

8. The method of claim 1 wherein forming a plasma within the toroidal plasma chamber further comprises:

exciting the first gas in the first side member of the toroidal plasma chamber; and exciting the second gas in the second side member of the toroidal plasma chamber.

9. The method of claim 1 wherein the inner cross-sectional area of the first side member is selected based on one or more of a resistivity, an electron life time, and a plasma diffusion length of the plasma formed using the first gas.

10. The method of claim 1 wherein the inner cross-sectional area of the first side member is further selected based on one or more of a flow rate, a temperature, a pressure, and a chemical property of the first gas.

11. The method of claim 1 wherein the inner cross-sectional area of the second side member is selected based on one or more of a resistivity, an electron life time, and a plasma diffusion length of the plasma formed using the second gas.

12. The method of claim 1 wherein the inner cross-sectional area of the second side member is further selected based on one or more of a flow rate, a temperature, a pressure, and a chemical property of the second gas.

13. A method for adjusting gas flow patterns and gas-plasma interactions, the method comprising:
   providing a toroidal plasma chamber comprising an injection member, an output member, a first side member and a second side member, the first side member connecting a first end of the injection member and the output member, and the second side member connecting a second end of the injection member and the output member,
      wherein the injection member, the output member, the first side member and the second side member form a toroidal plasma channel; and
   injecting, via a first gas injector, a first gas into the first side member of the toroidal plasma chamber through the first end of the injection member, wherein the first side member has an inner cross-sectional area selected to substantially match a size of a plasma formed using the first gas; and
   injecting, via a second gas injector, a second gas into the second side member of the toroidal plasma chamber through the second end of the injection member, wherein the second side member has an inner cross-sectional area selected to substantially match a size of a plasma formed using the second gas;
   forming a plasma within the toroidal plasma chamber based on a flow of gas caused by the injection of the first and second gases, wherein a plasma current circulates continuously in the toroidal plasma channel,
      wherein the first gas and the second gas are different gases, and the inner cross-sectional area of the first side member is different from the inner cross-sectional area of the second side member; and
   controlling the flow of gas caused by the injection of the first and second gases such that the plasma current flows substantially down a center of the toroidal plasma channel.

14. The method of claim 13, wherein controlling the flow of gas prevents the plasma current from contacting the toroidal plasma channel.

15. The method of claim 13, further comprising replacing the first side member with a third side member, wherein the inner cross-sectional area of the first side member is the same as an inner cross-sectional area of the third side member.

16. The method of claim 13, further comprising replacing the first side member with a third side member, wherein the inner cross-sectional area of the first side member is different from an inner cross-sectional area of the third side member.

17. The method of claim 13, further comprising replacing the second side member with a third side member, wherein the inner cross-sectional area of the second side member is the same as an inner cross-sectional area of the third side member.

18. The method of claim 13, further comprising replacing the second side member with a third side member, wherein the inner cross-sectional area of the second side member is different from an inner cross-sectional area of the third side member.

19. The method of claim 13, wherein the toroidal plasma chamber further comprises a first connector and a second connector, the first connector connecting the first side member and the first end of the injection member, and the second connector connecting the second side member and the second end of the injection member.

20. The method of claim 19, wherein the first connector comprises first segments and the second connector comprises second segments, wherein the first segments and the second segments distribute an electric potential along the toroidal plasma channel.

* * * * *